(12) United States Patent
Lee et al.

(10) Patent No.: US 7,067,370 B2
(45) Date of Patent: Jun. 27, 2006

(54) METHOD OF MANUFACTURING A MOS TRANSISTOR OF A SEMICONDUCTOR DEVICE

(75) Inventors: Dong-Hun Lee, Sungnam-si (KR); Jin-Suk Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 10/785,268

(22) Filed: Feb. 24, 2004

(65) Prior Publication Data

US 2004/0180504 A1 Sep. 16, 2004

(30) Foreign Application Priority Data

Mar. 12, 2003 (KR) .................. 10-2003-0015315

(51) Int. Cl.
*H01L 21/8238* (2006.01)
*H01L 21/425* (2006.01)

(52) U.S. Cl. .................. 438/231; 438/232; 438/530

(58) Field of Classification Search ................ 438/530, 438/224, 223, 228, 231, 232, 225, 289
See application file for complete search history.

(56) References Cited

U.S. PATENT DOCUMENTS 5,015,595 A 5/1991 Wollesen
5,872,047 A * 2/1999 Lee et al. .................. 438/530

FOREIGN PATENT DOCUMENTS

KR 0057380 7/1999

OTHER PUBLICATIONS

English Abstract***.

* cited by examiner

*Primary Examiner*—Walter L. Lindsay, Jr.
(74) *Attorney, Agent, or Firm*—F. Chau & Associates, LLC

(57) ABSTRACT

A method of manufacturing a transistor of a semiconductor device is provided. The method includes forming an N type gate pattern and a P type gate pattern on a substrate, implanting N type impurities into an N type transistor area, forming an insulation layer on the substrate including the N type gate pattern, forming a first spacer on a sidewall of the P type gate pattern by partially etching the insulation layer in a P type transistor area, and implanting P type impurities into the P type gate pattern and into the P type transistor area, thereby forming a CMOS transistor on the substrate. Thus, damage to the substrate and the transistor is prevented, thereby improving electrical characteristics of the transistor.

18 Claims, 7 Drawing Sheets

METHOD OF MANUFACTURING A MOS TRANSISTOR OF A SEMICONDUCTOR DEVICE

CROSS-REFERENCE TO RELATED APPLICATION

This application claims priority to Korean Patent Application No. 2003-15315, filed on Mar. 12, 2003, which is incorporated herein by reference in its entirety.

BACKGROUND OF THE INVENTION

1. Technical Field

The present invention relates, generally, to a method of manufacturing a metal oxide semiconductor (MOS) transistor. More particularly, the present invention relates to a method of manufacturing a complementary metal oxide semiconductor (CMOS) transistor having a lightly doped drain (LDD) structure in a semiconductor device.

2. Description of the Related Art

As technologies for manufacturing semiconductor devices have been developed and applications for memory devices have been expanded, memory devices having increased capacities have been required. In particular, integration density of a DRAM device, which includes memory cells composed of one capacitor and one transistor, has been remarkably improved.

A MOS transistor is widely employed in the DRAM device. A conventional MOS transistor having an LDD structure is disclosed in U.S. Pat. No. 5,956,591 and Japanese Laid Open Patent Publication No. 2000-311951.

FIG. 1 is a cross-sectional view illustrating a conventional MOS transistor, and FIG. 2 is an enlarged cross-sectional view of portion 'A' in FIG. 1. Referring to FIG. 1, a MOS transistor includes a gate insulation layer pattern 12 and a gate 14 formed on a semiconductor substrate 10 including source/drain regions 16. The source/drain regions 16 have an LDD region 16a and a highly doped drain (HDD) region 16b contacting the LDD region 16a. The LDD region 16a having a low impurity concentration is formed in a portion of the substrate 10 adjacent to the gate 14 while the HDD region 16b having a high impurity concentration is horizontally extended from the HDD region 16a.

The MOS transistors are generally divided into an N type MOS transistor and a P type MOS transistor in accordance with a type of a channel thereof. When the P type MOS transistor and the N type MOS transistor are formed on a semiconductor substrate, the combination of the P type and the N type MOS transistors form a CMOS transistor.

As the semiconductor devices become more highly integrated, a length of a gate of a MOS transistor decreases such that the MOS transistor has a very short channel having a length of less than a micrometer. Thus, several problems may occur in the MOS transistor because the MOS transistor has an extremely short channel, e.g., a short channel effect or punch-through. As a result, electrical characteristics of the MOS transistor deteriorate.

In particular, when the MOS transistor has the above-mentioned LDD structure, the LDD region 16a may be extended beneath the gate insulation layer pattern 12 so that the LDD region 16a may be overlapped with the gate 14 by a predetermined overlap length D, as shown in FIG. 2. When the overlapped length D is disadvantageously long, the channel length of the MOS transistor is reduced and a parasitic capacitance is increased due to the overlap between the LDD region 16a and the gate 14. On the other hand, when the overlapped length D is extremely short, the mobility of dopants may be reduced in the channel region of the MOS transistor, thereby decreasing an operation speed of the MOS transistor. Hence, the overlapped length D between the LDD region 16a and the gate 14 should be optimized to obtain a MOS transistor having desired electrical characteristics.

The overlap between the LDD region and the gate generally occurs in accordance with a horizontal diffusion of impurities implanted into the LDD region. To prevent the overlapped length from being extremely elongated according to an excessive diffusion of the impurities, the impurities may be implanted into the LDD region using a gate having a spacer as a mask after forming the spacer on a sidewall of the gate. Here, since the impurities implanted into the LDD region are spaced apart from the gate by a thickness of a spacer, the excessive elongation of the overlapped length may be prevented although the impurities are diffused toward the gate during subsequent manufacturing processes.

To form a CMOS transistor, however, when an N type MOS transistor and a P type MOS transistor have LDD regions, respectively, N type impurities may have a different diffusion length than a diffusion length of P type impurities. Generally, the N type impurities have a diffusion length shorter than that of the P type impurities. Thus, although spacers are formed on sidewalls of gates of the N type and P type MOS transistors to adjust overlapped lengths between the gates and the LDD regions, the overlap length of the N type MOS transistor may be different from that of the P type MOS transistor.

To prevent an increase of the overlap length as discussed above, a method of forming a CMOS transistor is disclosed in U.S. Pat. No. 6,316,302. In the method of forming a CMOS transistor, N type impurities are implanted into an N type transistor area of a substrate to form an N type LDD region using a gate pattern as a mask. After forming a spacer on a sidewall of the gate pattern, P type impurities are implanted into a P type transistor area of the substrate using the gate pattern including the spacer as a mask, thereby forming a P type LDD region. Since the P type LDD region is formed spaced apart from the gate pattern by a thickness of the spacer, an excessive increase in an overlap length between the P type LDD region and the gate pattern may be prevented. However, because an additional etching process is performed on the substrate including the N type LDD region to form the spacer on the sidewall of the gate pattern, a surface of the N type LDD region may be damaged during the etching process. When the N type LDD region is damaged, a surface resistance of the N type LDD region may be significantly increased, thereby deteriorating electrical characteristics of the CMOS transistor.

SUMMARY OF THE INVENTION

Exemplary embodiments of the present invention generally include methods of manufacturing a CMOS transistor of a semiconductor device having transistors with improved electrical characteristics and preventing etching damage to the semiconductor device by reducing the number of photolithography processes required for forming the CMOS transistor.

In an exemplary embodiment of the present invention, an N type gate pattern and a P type gate pattern are formed in an N type transistor area and a P type transistor area, respectively, of a semiconductor substrate. After N type impurities are selectively implanted into the N type transistor area, an insulation layer is formed on the substrate including the N type gate pattern and the P type gate pattern. A first spacer is formed on sidewalls of the P type gate pattern by anisotropically etching a portion of the insulation layer in the P type transistor area while a portion of the insulation layer remains in the N type transistor area. Then, P type impurities are selectively implanted into the P type gate pattern including the first spacer and into the P type transistor area, thereby forming a CMOS transistor on the substrate.

In accordance with another exemplary embodiment of the present invention, an N type gate pattern and a P type gate pattern are formed in an N type transistor area and a P type transistor area, respectively, of a semiconductor substrate. Here, each of the gate patterns includes a gate oxide layer pattern and an undoped polysilicon layer pattern. A thermally oxidized layer is formed on the substrate including the gate patterns to repair damage to the substrate and the gate patterns. N type impurities are selectively implanted into the N type gate patterns and into a portion of the substrate adjacent to the N type gate pattern to change the undoped polysilicon layer pattern into a conductive polysilicon layer and to form an N type impurity region having a low impurity concentration adjacent to the N type gate pattern. An insulation layer is formed on the substrate including the gate patterns. A first spacer is formed on sidewalls of the P type gate pattern by anisotropically etching a portion of the insulation layer in the P type transistor area while a portion of the insulation layer remains in the N type transistor area. Then, P type impurities are selectively implanted into the P type gate pattern and a portion of the substrate adjacent to the P type gate pattern to change the undoped polysilicon layer pattern into a conductive polysilicon layer pattern and to form a P type impurity region having a low impurity concentration adjacent to the P type gate pattern.

According to exemplary embodiments of the present invention, a first spacer is formed on a P type gate pattern without any additional photolithography processes so that a portion of a substrate, where an N type transistor is formed, is prevented from being damaged during formation of the first spacer. Thus, a failure such as increased resistance of an N type LDD region may be prevented. In addition, characteristics of an N type transistor and a P type transistor may be improved because diffusion paths of impurities implanted into source/drain regions of transistors may be advantageously adjusted.

These and other exemplary embodiments, features, aspects, and advantages of the present invention will be described and become apparent from the following detailed description of the exemplary embodiments when read in conjunction with the accompanying drawings.

DETAILED DESCRIPTION OF EXEMPLARY EMBODIMENTS

Figure 1:
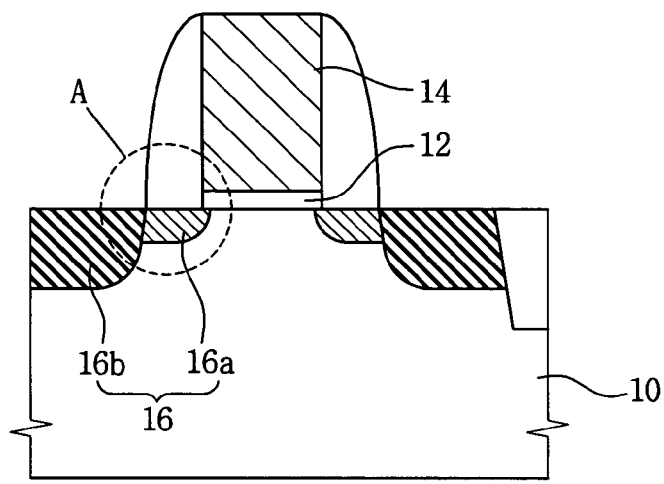
FIG. 1 is a cross-sectional view illustrating a conventional MOS transistor.
Figure 2:
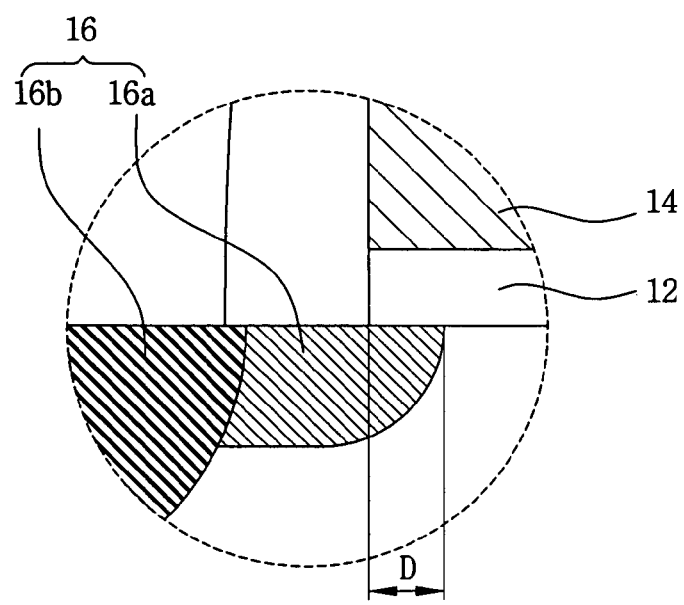
FIG. 2 is an enlarged cross-sectional view of portion 'A' in FIG. 1.

Hereinafter, the exemplary embodiments of the present invention will be explained with reference to the accompanying drawings. In the following drawings, like reference numerals identify similar or identical elements. It should be understood that the exemplary embodiments described below are provided so that this disclosure will be thorough and complete, and will fully convey the concept of the invention to those skilled in the art by way of example and not of limitation.

Figure 3A:
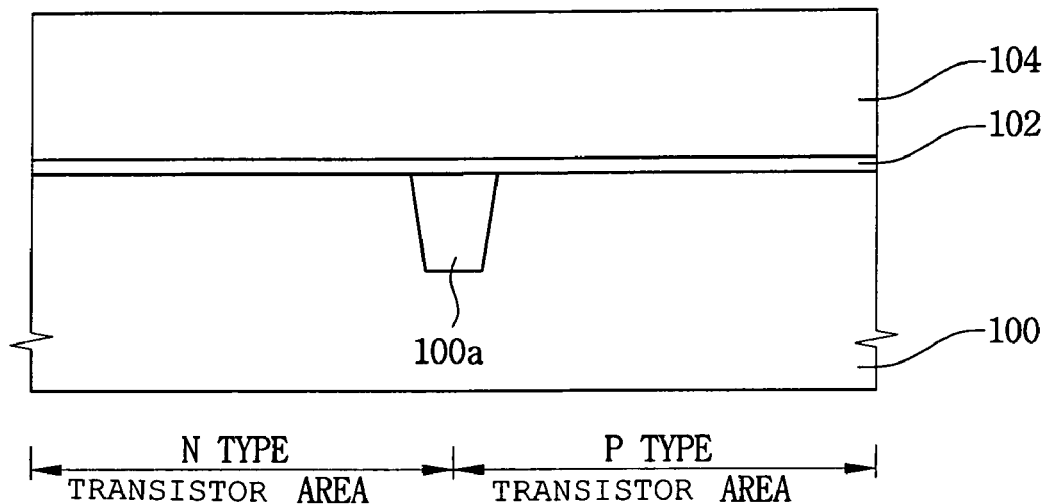
FIGS. 3A to 3L are cross-sectional views illustrating a method of manufacturing a MOS transistor of a semiconductor device in accordance with an exemplary embodiment of the present invention.

Referring to FIG. 3A, a semiconductor substrate 100 is divided into an active region and a field region 100a by a trench isolation process. Here, an N type transistor area and a P type transistor area are formed on the semiconductor substrate 100. An N type MOS transistor and a P type MOS transistor are formed on the N type transistor area and the P type transistor area, respectively. Particularly, after a pad oxide layer is formed on the substrate 100, a nitride layer and a high temperature oxide (HTO) layer are successively formed on the substrate 100, and an anti-reflective layer (ARL) of silicon oxynitride is then formed on the HTO layer. An HTO layer pattern is formed on the nitride layer by a photolithography process. The nitride layer and the pad oxide layer are etched using the HTO layer pattern as an etching mask to form a nitride layer pattern and a pad oxide layer pattern on the substrate 100. A trench having a predetermined depth is formed in the substrate 100 by partially etching the substrate 100. Then, using a chemical vapor deposition (CVD) process, an oxide layer is formed on the substrate 100 to fill the trench formed therein. Next, the oxide layer is removed by a chemical mechanical polishing (CMP) process until the nitride layer pattern is exposed. As a result, a field oxide layer is formed in the trench. The nitride layer pattern is then removed by a stripping process using a solution including phosphoric acid. When the above-described trench isolation process is completed, the semiconductor substrate 100 is divided into the active region and the field region 100a.

Referring now to FIG. 3A, a gate oxide layer 102 is formed on the substrate 100 including the active region and the field region 100a. Preferably, the gate oxide layer 102 has a thickness of about 30 to about 150 Å. In addition, the gate oxide layer 102 preferably includes silicon oxide.

An undoped polysilicon layer 104 is formed on the gate oxide layer 102.

Figure 3B:
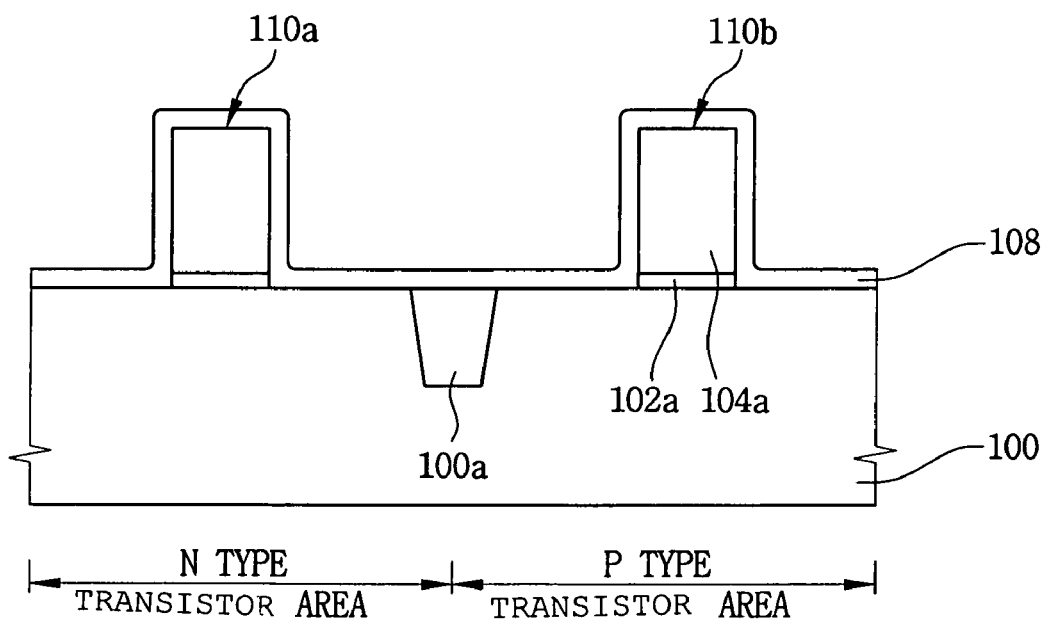

Referring to FIG. 3B, the undoped polysilicon layer 104 and the gate oxide layer 102 are partially etched to form gate patterns on the substrate 100. Each of the gate patterns includes a gate oxide layer pattern 102a formed on the substrate 100 and an undoped polysilicon layer pattern 104a formed on the gate oxide layer pattern 102a. A thermally oxidized layer 108 is formed on the substrate 100 including the gate patterns to repair damage to the gate pattern and the substrate 100 caused by the etching process for forming the gate patterns. Preferably, the thermally oxidized layer 108 has a thickness of about 30 to about 70 Å. The gate patterns correspond to gates of an N type transistor and a P type transistor. Hereinafter, a gate pattern corresponding to the gate of the N type transistor is referred to as an N type gate pattern 110a, whereas a gate pattern corresponding to the gate of the P type transistor is referred to as a P type gate pattern 110b.

In an exemplary embodiment of the present invention, a first photoresist pattern is formed on the undoped polysilicon layer 104 to form the gate patterns. The undoped polysilicon layer 104 and the gate oxide layer 102 are successively etched using the first photoresist pattern as an etching mask. When the first photoresist pattern is removed by an ashing and a stripping process, the gate patterns are formed on the substrate 100.

Figure 3C:
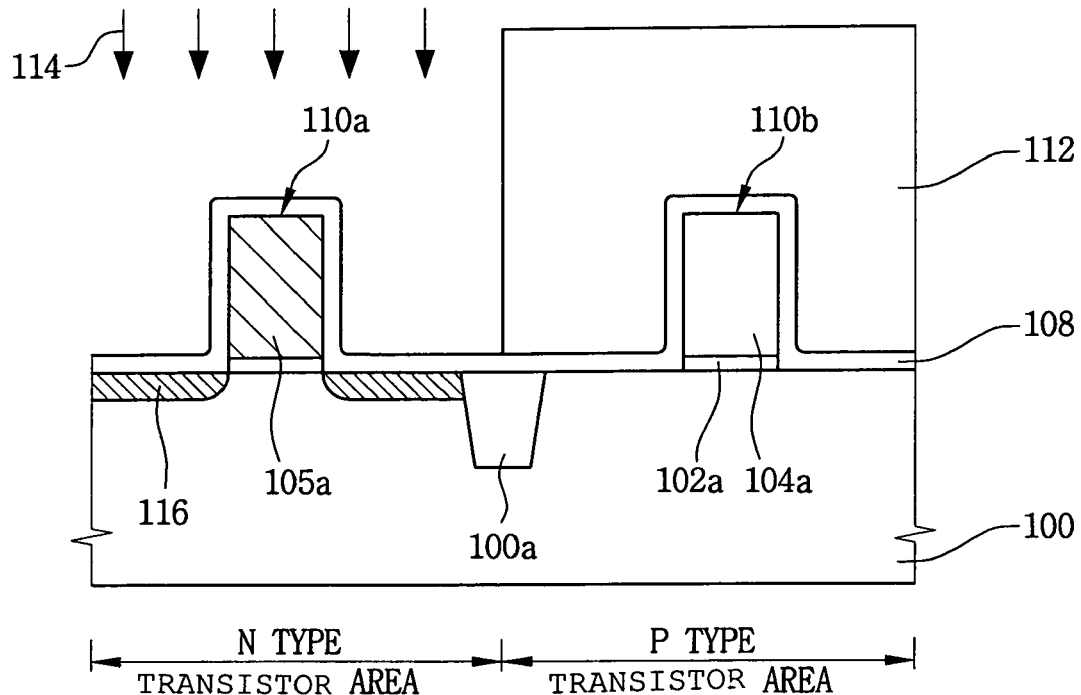

Referring to FIG. 3C, a second photoresist pattern 112 is formed on the substrate 100 including the thermally oxidized layer 108. Here, the second photoresist pattern 112 selectively exposes the N type transistor area. That is, the second photoresist pattern 112 covers the P type transistor area and exposes the N type transistor area.

N type impurities 114 are implanted into the N type transistor area by an ion implantation process using the second photoresist pattern 112 as a mask. Here, the N type transistor region has a low impurity concentration. As a result, the N type impurities are implanted into the undoped polysilicon layer pattern 104a and a portion of the substrate 100 adjacent to the N type gate pattern 110a.

When the N type impurities 114 are implanted into the undoped polysilicon layer pattern 104a, the undoped polysilicon layer pattern 104a is changed into a conductive polysilicon layer pattern 105a that has electrical conductivity due to the N type impurities implanted therein. In addition, an N type lightly doped drain (LDD) region 116 is formed at the portion of the substrate 100 adjacent to the N type gate pattern 110a.

According to another exemplary embodiment, the N type impurities advantageously include arsenic (As) ions because an arsenic ion has an atomic weight greater than that of other N type ions such as phosphorus (P). Thus, arsenic ions may not rapidly diffuse into substrate 100, and the horizontal diffusion path of the arsenic ions may be smaller than that of other N type ions. When the N type LDD region 116 is formed using arsenic ions, the N type LDD region 116 may be prevented from exceedingly extending toward a channel region under the N type gate pattern 110a.

The second photoresist pattern 112 is removed by an ashing and a stripping process.

Figure 3D:
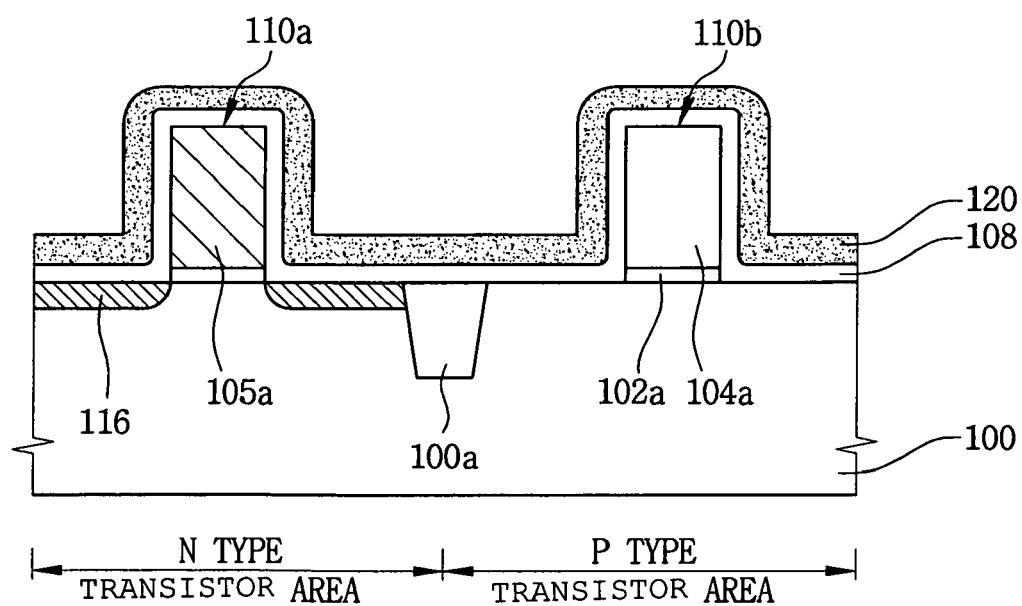

Referring to FIG. 3D, a first insulation layer 120 is formed on the thermally oxidized layer 108 so as to form a first spacer. The first insulation layer 120 may be used to adjust an overlap length caused by the horizontal diffusion of P type impurities subsequently implanted. Hence, the first insulation layer 120 has a predetermined thickness based upon the diffusion path of the P type impurities. Preferably, the first insulation layer 120 has a thickness of about 150 to about 250 Å.

In yet another exemplary embodiment of the present invention, the first insulation layer 120 is formed using material that has an etching selectivity relative to the thermally oxidized layer 108. Preferably, the first insulation layer 120 includes silicon nitride. Thus, when the first insulation layer 120 is anisotropically etched during a subsequent etching process, the thermally oxidized layer 108 may remain on the substrate 100 so that the substrate 100 may not be exposed. As a result, damage to the substrate 100 may be prevented during the etching process for anisotropically etching the first insulation layer 120.

The first insulation layer 120 is preferably formed at a low temperature to minimize the horizontal diffusion of the N type impurities. When the first insulation layer 120 includes silicon nitride, the first insulation layer 120 may be advantageously formed at a temperature of about 650 to about 800° C.

Figure 3E:
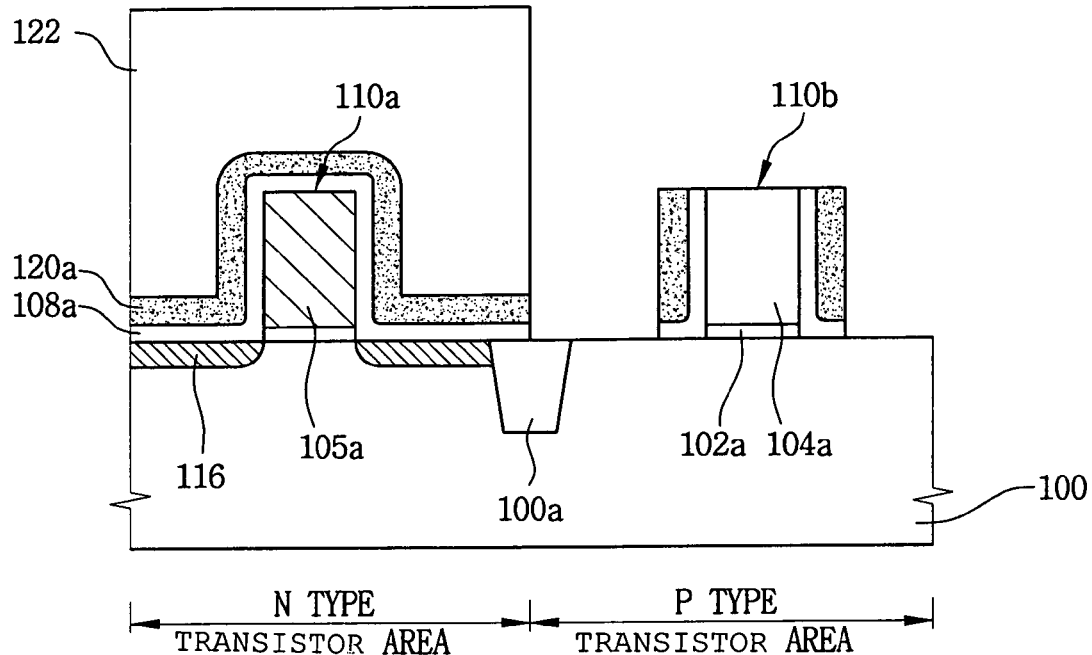

Referring to FIG. 3E, a third photoresist pattern 122 is formed on the first insulation layer 120. The third photoresist pattern 122 selectively exposes the P type transistor area.

A portion of the first insulation layer 120 in the P type transistor area is anisotropically etched using the third photoresist pattern 122 as an etching mask. When the anisotropic etching process is performed on the first insulation layer 120, a portion of the first insulation layer 120a and a portion of the thermally oxidized layer 108a remain in the N type transistor area. On the other hand, a first spacer 130 is formed on sidewalls of the P type gate pattern 110b. The first spacer 130 includes a portion of the thermally oxidized layer 108b formed on the sidewalls of the P type gate pattern 110b and a portion of the first insulation layer 120b formed on the portion of the thermally oxidized layer 108b. As shown in FIG. 3E, the first spacer 130 has an angular edge portion, which corresponds to an offset spacer.

A cleaning process is performed on the substrate 100 including the resultant structure to remove impurities such as polymers generated during the etching processes. According to the cleaning process, a portion of the thermally oxidized layer 108 remaining on the P type gate pattern 110b and on the substrate is substantially removed. Although a minute portion of the thermally oxidized layer 108 may remain on the substrate 100 and the P type gate pattern 110b, the portion of the thermally oxidized layer 108 remaining on the substrate 100 and the P type gate pattern 110b does not cause any problems during subsequent manufacturing processes.

Figure 3F:
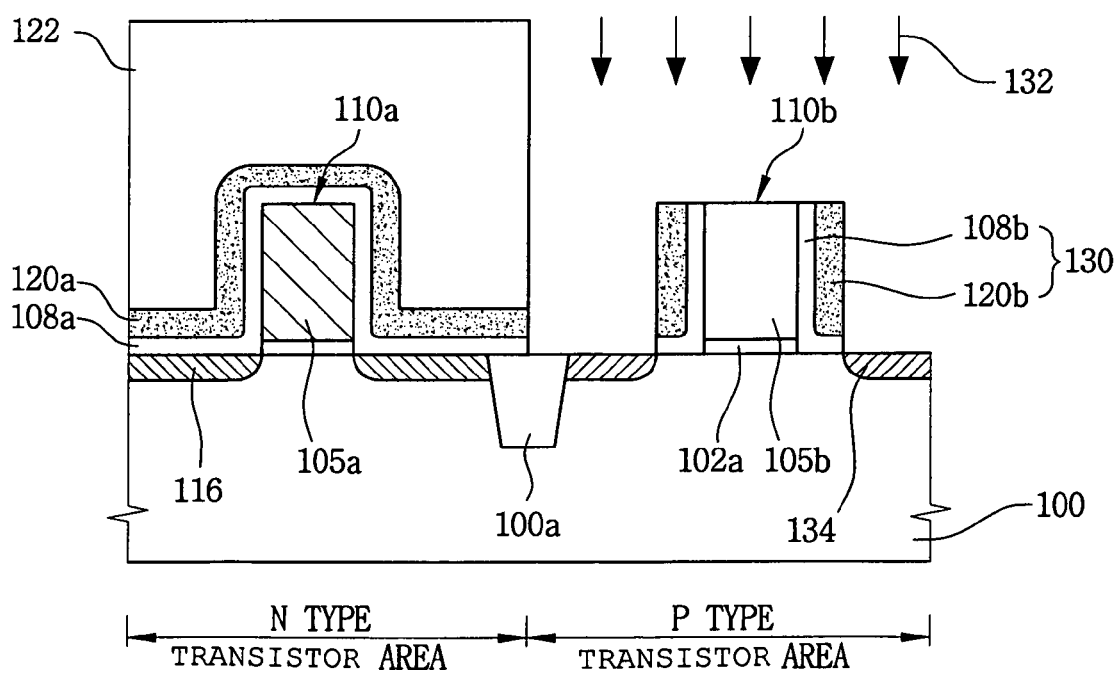

Referring to FIG. 3F, the P type impurities 132 are selectively implanted into the P type gate pattern 110b and the P type transistor area using the third photoresist pattern 122 as a mask. When the P type impurities 132 are implanted into the P type gate pattern 110 having the first spacer 130, the undoped polysilicon layer pattern 104a is changed into a conductive polysilicon layer pattern 105b that has electrical conductivity. Since the P type impurities 132 are implanted into the P type gate pattern 110b, the formation of a buried channel region at a portion of the substrate 100 beneath the P type gate pattern 110b is prevented.

After the P type impurities 132 are implanted into a portion of the substrate 100 adjacent to the P type gate pattern 110b, a P type LDD region 134 is formed at the portion of the substrate 100 adjacent to the P type gate pattern 110b.

In still another exemplary embodiment of the present invention, the P type impurities advantageously include boron (B) ions. Since a boron ion has an atomic weight less than that of the arsenic ion of the N type impurities, the boron ion may rapidly diffuse into the substrate 100. Thus, when the P type LDD region 134 is formed by implanting the boron ions, the boron ions may horizontally diffuse toward a channel region under the P type gate pattern 110b during subsequent manufacturing processes. However, in the present embodiment, the excess overlap between the P type LDD region 134 and the P type gate pattern 110b is prevented because the P type LDD region 134 is formed at the portion of the substrate 100 beneath the first spacer 130. In other words, since the P type LDD region 134 is spaced apart from the P type gate pattern 110b by the thickness of the first spacer 130, the P type LDD region 134 is prevented from excessively overlapping with the P type gate pattern 110b although the P type impurities 132 may horizontally diffuse during subsequent thermal processes.

The third photoresist pattern 122 serves as a mask during the ion implantation process and for selectively forming the first spacer 130 on the sidewalls of the P type gate pattern 110b. Hence, the ion implantation process is achieved without an additional photolithography process.

Figure 3G:
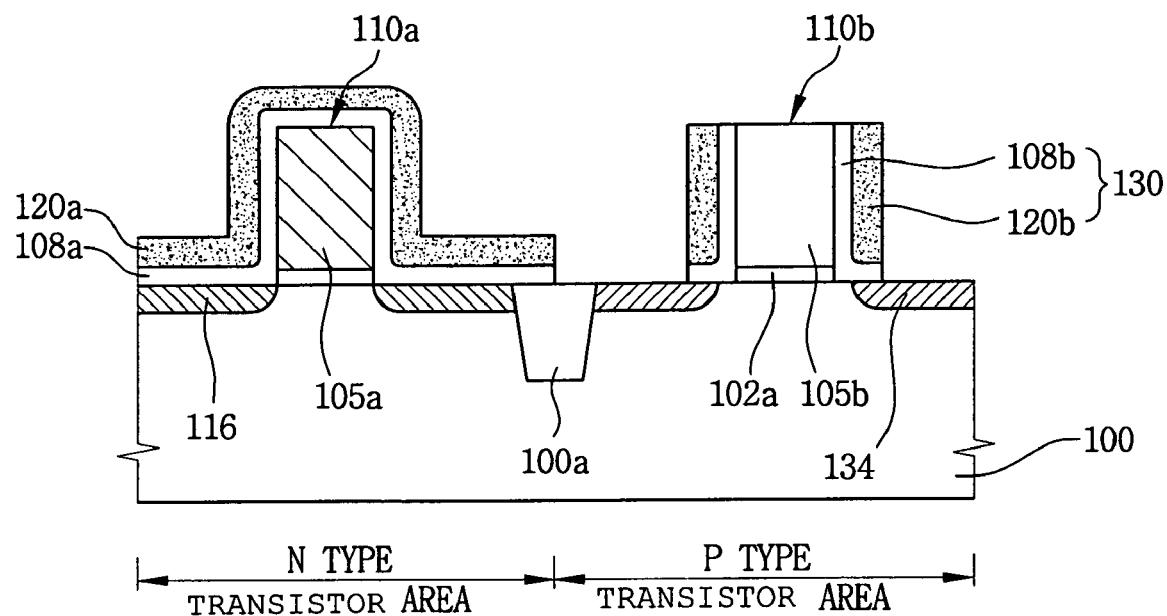

Referring to FIG. 3G, the third photoresist pattern 122 is removed by an ashing and a stripping process. Here, the ashing process is performed using an ozone ($O_3$) plasma, and the stripping process is executed using a sulphuric acid solution or a solution that includes sulphuric acid and a standard cleaning 1 (SC 1) solution. The SC 1 solution contains ammonium hydroxide ($NH_4OH$), hydrogen peroxide ($H_2O_2$) and water ($H_2O$).

Figure 3H:
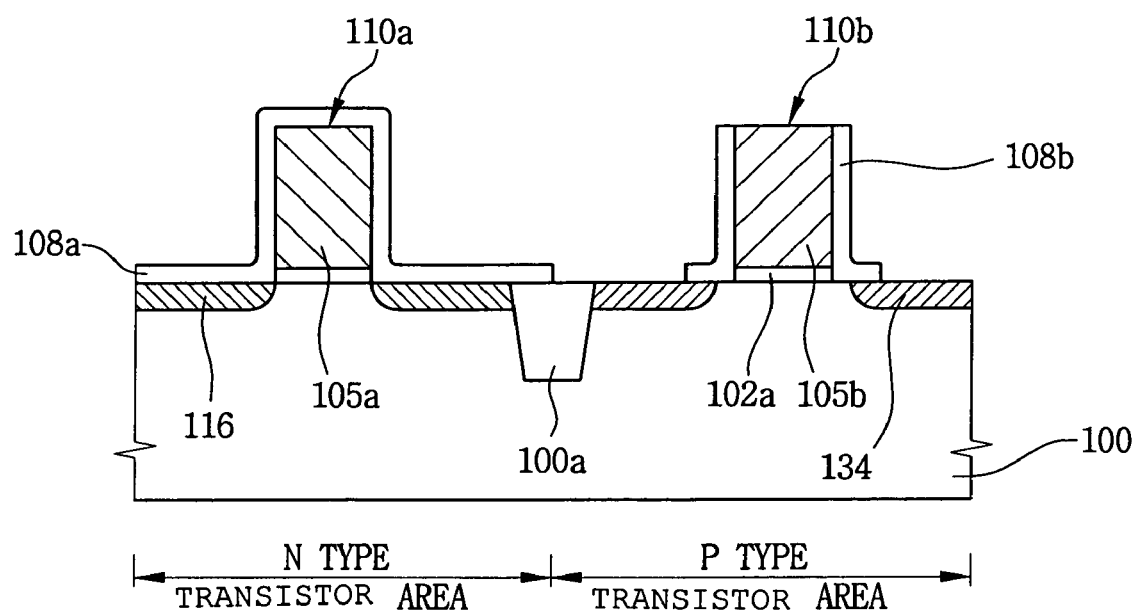

Referring to FIG. 3H, the remaining first insulation layer 120a in the N type transistor area and the first insulation layer pattern 120b of the first spacer 130 in the P type transistor area are simultaneously etched. This etching process is preferably performed using a wet etching process to reduce damage to substrate 100. When the portion of first insulation layer 120a and the first insulation layer pattern 120b include nitride, the portion of first insulation layer 120a and the first insulation layer pattern 120b are removed using an etching solution comprising phosphoric acid ($H_3PO_4$).

Figure 3I:
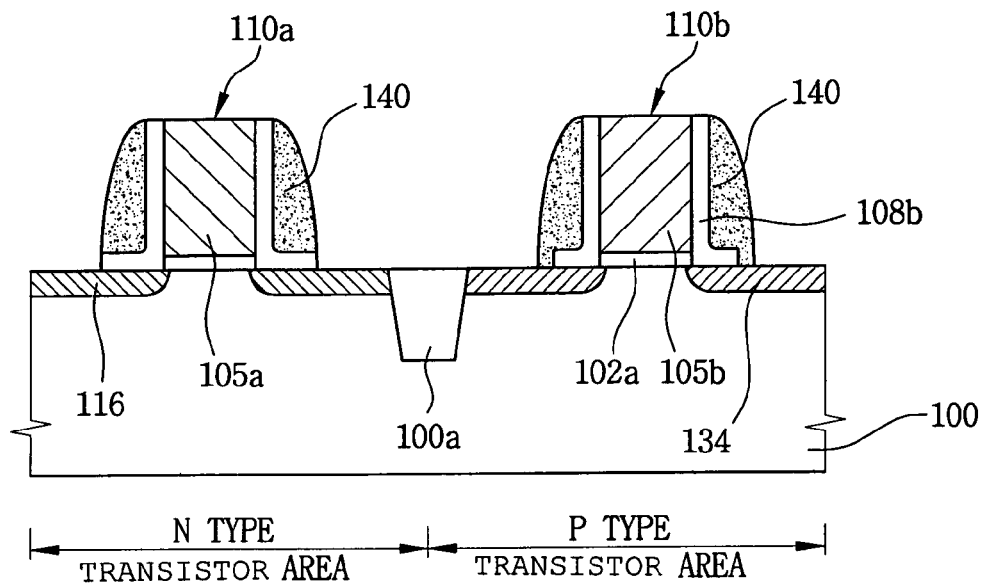

Referring to FIG. 3I, a second insulation layer is formed on the substrate 100 including the resultant structure. Preferably, the second insulation layer comprises nitride such as silicon nitride.

The second insulation layer is anisotropically etched to form second spacers 140 on sidewalls of the N type gate pattern 110a and on sidewalls of the P type gate pattern 110b. The second spacers 140 serve as masks to form source/drain regions of the N type and the P type transistors. Here, the source/drain regions are doped with impurities of high concentrations.

After the anisotropic process is executed, a cleaning process is performed on the substrate 100 including the N type and the P type gate patterns 110a and 110b having the second spacers 140. The remaining thermally oxidized layer 108 is completely removed by the cleaning process.

Figure 3J:
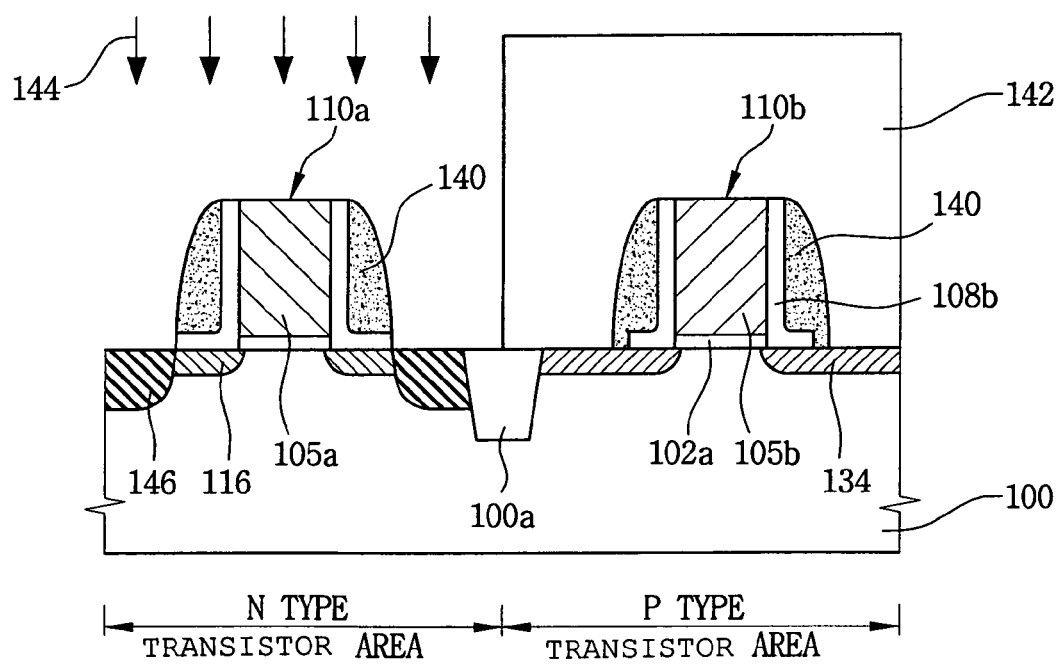

Referring to FIG. 3J, a fourth photoresist pattern 142 is formed on the substrate 100 where the N type gate pattern 110a, the P type gate pattern 110b and the second spacers 140 are formed. The fourth photoresist pattern 142 selectively exposes the N type transistor area.

N type impurities 144 are selectively implanted into the N type transistor area using the fourth photoresist pattern 142 as a mask. When the N type impurities 144 are implanted into the portion of the substrate 100 adjacent to the N type gate pattern 110a including the second spacer 140, an N type impurity region 146 having a high impurity concentration is formed at the portion of the substrate 100 adjacent to the LDD region 116 because the N type impurities 114, as shown in FIG. 3C, and N type impurities 144 are both implanted into the portion of the substrate 100 adjacent to the N type LDD region 116. The N type impurity region 146 having a high impurity concentration corresponds to the source/drain region of the N type transistor. Additionally, the N type impurities 144 are implanted into the conductive polysilicon pattern 105a of the N type gate pattern 110a.

The N type impurities 144 include arsenic ions or phosphorus ions for forming the N type impurity region 146 having a high impurity concentration. Preferably, phosphorus ions are implanted to form the N type impurity region 146 having the high impurity concentration. Thus, the N type impurity region 146 having the high impurity concentration has a depth greater than that of the N type LDD region 116 because the phosphorus ions have atomic weight less than that of the arsenic ions.

The fourth photoresist pattern 142 is removed by an ashing and a stripping process.

Figure 3K:
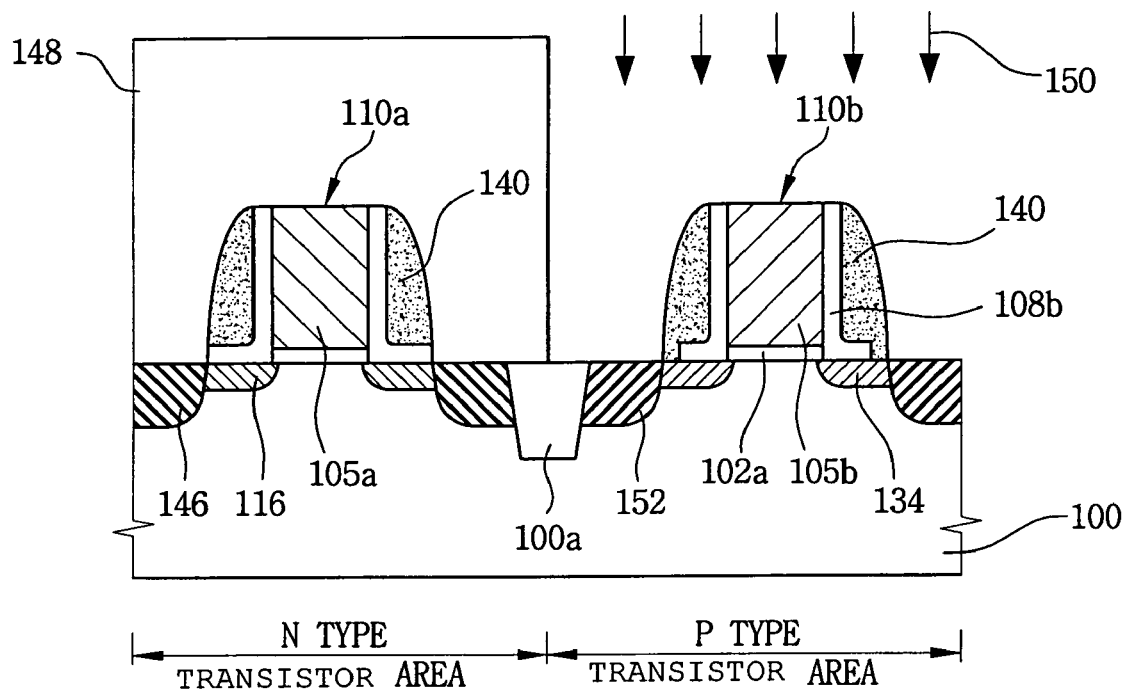

Referring to FIG. 3K, a fifth photoresist pattern 148 is formed on the substrate 100 on which the N type gate pattern 110a, the P type gate pattern 110b, and the second spacers 140 are formed. The fifth photoresist pattern 148 selectively exposes the P type transistor area.

P type impurities 150 are implanted into the portion of the substrate 100 adjacent to the P type gate pattern 110b having the second spacers 140 using the fifth photoresist pattern 148 as a mask. When the P type impurities 150 are implanted into the portion of the substrate 100 adjacent to the P type gate pattern 110b having the second spacers 140, a P type impurity region 152 having a high impurity concentration is formed at the portion of the substrate 100 adjacent to the P type LDD region 134 because the P type impurities 132, as depicted in FIG. 3F, and the P type impurities 150 are both implanted into the portion of the substrate 100 adjacent to the P type LDD region 134. The P type impurity region 152 having the high impurity concentration corresponds to the source/drain regions of the P type transistor. Additionally, the P type impurities 150 are implanted into the conductive polysilicon pattern 105a of the P type gate pattern 110b. The P type impurities 150 preferably include boron ions.

In still yet another exemplary embodiment of the present invention, after the P type impurities 150 are implanted into the portion of the substrate 100 adjacent to the P type gate pattern 110b having the second spacers 140, the N type impurities 144 may be implanted into the portion of the substrate 100 adjacent to the N type gate pattern 110a having the second spacers 140.

Figure 3L:
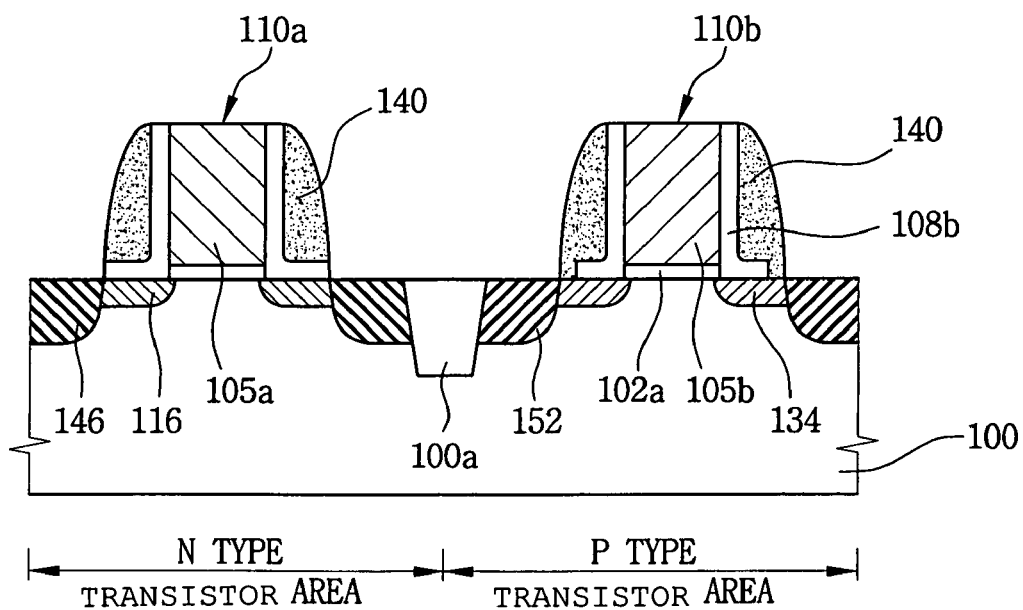

Referring to FIG. 3L, the fifth photoresist pattern 148 is removed, thereby forming a CMOS transistor including the N type and the P type transistors on the substrate 100.

Metal silicide layer patterns (not shown) are formed on the N type and the P type gate patterns 110a and 110b, and on the source/drain regions. The metal silicide patterns may reduce resistance between the gate patterns 110a and 110b and the source/drain regions.

According to exemplary embodiments the present invention, a first spacer is formed on a P type gate pattern without any additional photography processes, thereby preventing damage to a portion of a substrate where N type transistor is formed. Thus, a failure such as increased resistance of an N type LDD region is prevented. In addition, electrical characteristics of an N type transistor and a P type transistor are improved because diffusion paths of impurities implanted into source/drain regions of transistors may be advantageously adjusted.

The present invention has been described with reference to various exemplary embodiments thereof. The scope of the present invention must not be interpreted, however, as being restricted to these exemplary embodiments. Rather, it will be apparent to those of ordinary skill in the art that various modifications may be made to the described exemplary embodiments without departing from the spirit and scope of the invention.

What is claimed is:

1. A method of forming a transistor of a semiconductor device comprising:

forming an N type gate pattern and a P type gate pattern on an N type transistor area and a P type transistor area, respectively, of a semiconductor substrate;

selectively implanting N type impurities into the N type transistor area;

forming an insulation layer on the substrate including the N type gate pattern and the P type gate pattern;

forming a first spacer on sidewalls of the P type gate pattern by forming a photoresist pattern on the substrate to selectively expose the P type transistor area, using the photoresist pattern as an etching mask, and anisotropically etching a portion of the insulation layer in the P type transistor area while a portion of the insulation layer remains in the N type transistor area; and forming a P type impurity region having a low impurity concentration and a P type conductive gate pattern by selectively implanting P type impurities into the P type gate pattern including the first spacer and into the P type transistor area using the photoresist pattern as a mask.

2. The method of claim 1, wherein the N type gate pattern and the P type gate pattern include a gate oxide layer pattern and an undoped polysilicon layer pattern.

3. The method of claim 1, wherein implanting the N type impurities comprises:
forming a photoresist pattern on the substrate to selectively expose the N type transistor area;
forming an N type impurity region having a low impurity concentration and an N type conductive gate pattern by implanting the N type impurities into the N type gate pattern and into the N type transistor area using the photoresist pattern as a mask; and
removing the photoresist pattern.

4. The method of claim 1, wherein the N type impurities include arsenic (As).

5. The method of claim 1, wherein the insulation layer includes silicon nitride.

6. The method of claim 1, wherein the insulation layer is formed at a temperature of about 700 to about 800° C.

7. The method of claim 1, wherein the P type impurities include boron (B).

8. A method of forming a transistor of a semiconductor device comprising:
forming an N type gate pattern and a P type gate pattern on an N type transistor area and a P type transistor area, respectively, of a semiconductor substrate;
forming an oxide layer on the substrate including the N type gate pattern and the P type gate pattern to repair damage to the substrate and the gate patterns after forming the N type gate pattern and the P type gate pattern;
selectively implanting N type impurities into the N type transistor area;
forming an insulation layer on the substrate including the N type gate pattern and the P type gate pattern;
forming a first spacer on sidewalls of the P type gate pattern by anisotropically etching a portion of the insulation layer in the P type transistor area while a portion of the insulation layer remains in the N type transistor area; and
selectively implanting P type impurities into the P type gate pattern including the first spacer and into the P type transistor area.

9. A method of forming a transistor of a semiconductor device comprising:
forming an N type gate pattern and a P type gate pattern on an N type transistor area and a P type transistor area, respectively, of a semiconductor substrate;
selectively implanting N type impurities into the N type transistor area;
forming an insulation layer on the substrate including the N type gate pattern and the P type gate pattern;
forming a first spacer on sidewalls of the P type gate pattern by anisotropically etching a portion of the insulation layer in the P type transistor area while a portion of the insulation layer remains in the N type transistor area;
selectively implanting P type impurities into the P type gate pattern including the first spacer and into the P type transistor area;
selectively removing the portion of the insulation layer in the N type transistor area and selectively removing the first spacer on the P type transistor region;
forming second spacers on sidewalls of the N type gate pattern and the P type gate pattern;
selectively implanting N type impurities into the N type gate pattern and into the N type transistor area; and
selectively implanting P type impurities into the P type gate pattern and into the P type transistor area.

10. The method of claim 9, wherein the insulation layer and the first spacer are selectively removed by a wet etching process.

11. The method of claim 10, wherein the insulation layer and the first spacer are removed using an etching solution including phosphoric acid ($H_3PO_4$).

12. The method of claim 9, wherein the N type impurities include phosphorus (P) or arsenic (As).

13. A method of forming a transistor of a semiconductor device comprising:
forming an N type gate pattern and a P type gate pattern on an N type transistor area and a P type transistor area, respectively, of a semiconductor substrate, wherein each of the gate patterns includes a gate oxide layer pattern and an undoped polysilicon layer pattern;
forming a thermal oxidized layer on the substrate including the gate patterns to repair damage to the substrate and the gate patterns;
selectively implanting N type impurities into the N type gate patterns and into a portion of the substrate adjacent to the N type gate pattern to change the undoped polysilicon layer pattern into a conductive polysilicon layer and to form an N type impurity region having a low impurity concentration adjacent to the N type gate pattern;
forming an insulation layer on the substrate including the gate patterns;
forming a first spacer on sidewalls of the P type gate pattern by anisotropically etching a portion of the insulation layer in the P type transistor area while a portion of the insulation layer remains in the N type transistor area; and
selectively implanting P type impurities into the P type gate pattern and a portion of the substrate adjacent to the P type gate pattern to change the undoped polysilicon layer pattern into a conductive polysilicon layer pattern and to form a P type impurity region having a low impurity concentration adjacent to the P type gate pattern.

14. The method of claim 13, wherein the insulation layer includes silicon nitride.

15. The method of claim 13, wherein the insulation layer has a thickness of about 160 to about 240 Å.

16. The method of claim 13, wherein forming the first spacer comprises:
forming a photoresist pattern on the substrate to selectively expose the P type transistor area, wherein forming the first spacer on the sidewalls of the P type gate pattern by anisotropically etching the portion of the insulation layer in the P type transistor area includes using the photoresist pattern as an etching mask.

17. The method of claim 16, wherein selectively implanting the P type impurities comprises:
using the photoresist pattern as a mask; and
removing the photoresist pattern.

18. The method of claim 13, after forming the first spacer, further comprising:
- selectively removing the portion of the insulation layer in the N type transistor area and a portion of the first spacer in the P type transistor area;
- forming second spacers on sidewalls of the gate patterns;
- selectively implanting N type impurities into the N type gate pattern and into the portion of the substrate adjacent to the N type gate pattern including the second spacers to form an N type impurity region having a high impurity concentration adjacent to the N type impurity region having the low impurity concentration; and
- selectively implanting P type impurities into the P type gate pattern and into the portion of the substrate adjacent to the P type gate pattern having the second spacers to form a P type impurity region having a high impurity concentration adjacent to the P type impurity region having the low impurity concentration.

* * * * *